United States Patent [19]
Koike

[11] Patent Number: 5,625,329
[45] Date of Patent: Apr. 29, 1997

[54] SURFACE ACOUSTIC WAVE FILTER WITH AN OPTIMIZING REFLECTOR THICKNESS-TO-WAVELENGTH RATIO

[75] Inventor: Jun Koike, Nagaokakyo, Japan

[73] Assignee: Murata Manufacturing Co., Ltd., Japan

[21] Appl. No.: 634,064

[22] Filed: Apr. 17, 1996

Related U.S. Application Data

[63] Continuation of Ser. No. 293,717, Aug. 22, 1994, abandoned.

[30] Foreign Application Priority Data

Aug. 24, 1993 [JP] Japan .................................. 5-209228

[51] Int. Cl.$^6$ .................................................. H03H 9/64
[52] U.S. Cl. .................. 333/195; 310/313 A; 310/313 D
[58] Field of Search ................................. 333/193, 194, 333/195; 310/313 A, 313 D

[56] References Cited

U.S. PATENT DOCUMENTS

| | | | |
|---|---|---|---|
| 4,501,987 | 2/1985 | Mitsuyu et al. | 310/313 A |
| 4,635,009 | 1/1987 | Ebata | 310/313 D X |
| 4,978,879 | 12/1990 | Satoh et al. | 310/313 D X |
| 5,287,036 | 2/1994 | Penunori | 310/313 D X |

FOREIGN PATENT DOCUMENTS

WO-A9109464  6/1991  WIPO.

OTHER PUBLICATIONS

Microwave Journal, vol. 23, No. 11, Nov. 1980, Dedham US pp. 22–33, R.D. Colvin, "UHF Acoustic Oscillators".
European Search Report dated Nov. 30, 1994.

*Primary Examiner*—Benny T. Lee
*Assistant Examiner*—Justin P. Bettendorf
*Attorney, Agent, or Firm*—Ostrolenk, Faber, Gerb & Soffen, LLP

[57] ABSTRACT

A SAW device formed by providing at least one interdigital transducer on a piezoelectric substrate which is prepared by forming a (11$\bar{2}$0) ZnO piezoelectric thin film on a (01$\bar{1}$2) plane $\alpha$-Al$_2$O$_3$ substrate, and forming reflectors on both sides of the interdigital transducer along a surface wave propagation direction. Each of the reflectors is so structured that a ratio H/$\lambda$ of its thickness H to a wavelength $\lambda$ of a surface wave is in a range of 0.015 to 0.041.

6 Claims, 7 Drawing Sheets

SURFACE ACOUSTIC WAVE FILTER WITH AN OPTIMIZING REFLECTOR THICKNESS-TO-WAVELENGTH RATIO

This is a continuation of application Ser. No. 08/293,717 filed on Aug. 22, 1994, now abandoned.

BACKGROUND OF THE INVENTION

1. Field of the Invention

The present invention relates to a surface acoustic wave (SAW) device employing a ZnO piezoelectric thin film, and more particularly, it relates to an improvement in a SAW device having such a structure that grating reflectors are arranged on both sides of an IDT (inter digital transducer).

2. Description of the Background Art

In recent years, mobile radio communication device, have been watched with interest. Table 1 shows frequency bands and necessary bandwidths (pass bandwidths/central frequencies) in such systems.

TABLE 1

| System | Frequency Band (MHz) | Specific Bandwidth (%) | 1.5 Times Specific Bandwidth |
|---|---|---|---|
| Portable Telephone of 800 to 900 MHz | 800–900 | 2.7–3.8 | 4.1–5.7 |
| JDC of 1.5 GHz | 1400–1500 | 1.6–1.7 | 2.4–2.6 |
| PHP | 1900 | 1.3 | 2.0 |
| DECT | 1900 | 1.1 | 1.65 |

Referring to Table 1, the meanings of the abbreviations of the systems are as follows:

JDC: Japan Digital Cellular
PHP: Personal Handy Phone
DECT: Digital European Cordless Telephone As understood from Table 1, the specific bandwidth is at least 1% in every communication system. Therefore, an RF stage filter which is employed for a terminal of such a system must have a specific bandwidth of at least 1%, while its insertion loss in the band must be reduced to a considerably low level of about several dB.

Figure 1:
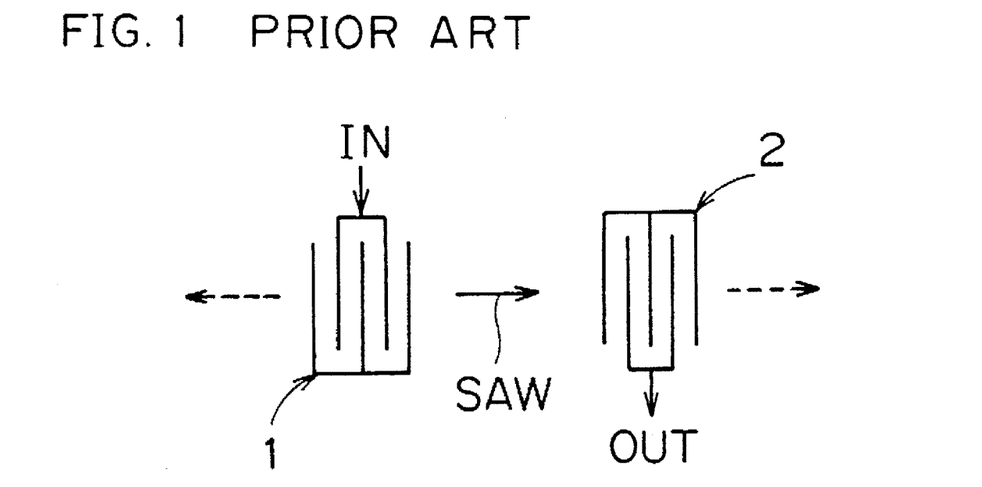
FIG. 1 is a schematic plan view for illustrating a conventional two IDTs type SAW filter.

An IIDT type (interdigitated interdigital type) SAW filter is widely employed as a filter having a wide band and low insertion loss. Such an IIDT type SAW filter is widely employed for the following reason:

As schematically shown in FIG. 1, a surface wave which is excited in an input side interdigital transducer (hereinafter referred to as "IDT") 1 is propagated to an output side IDT 2, where an output is taken out from the output side IDT 2. In this ordinary type of SAW with two IDTs, however, the surface wave is bidirectionally radiated from the IDTs 1 and 2. Thus, leakage signals are generated as shown by broken arrows in FIG. 1, causing a considerably large bidirectional loss of about 6 dB.

Figure 2:
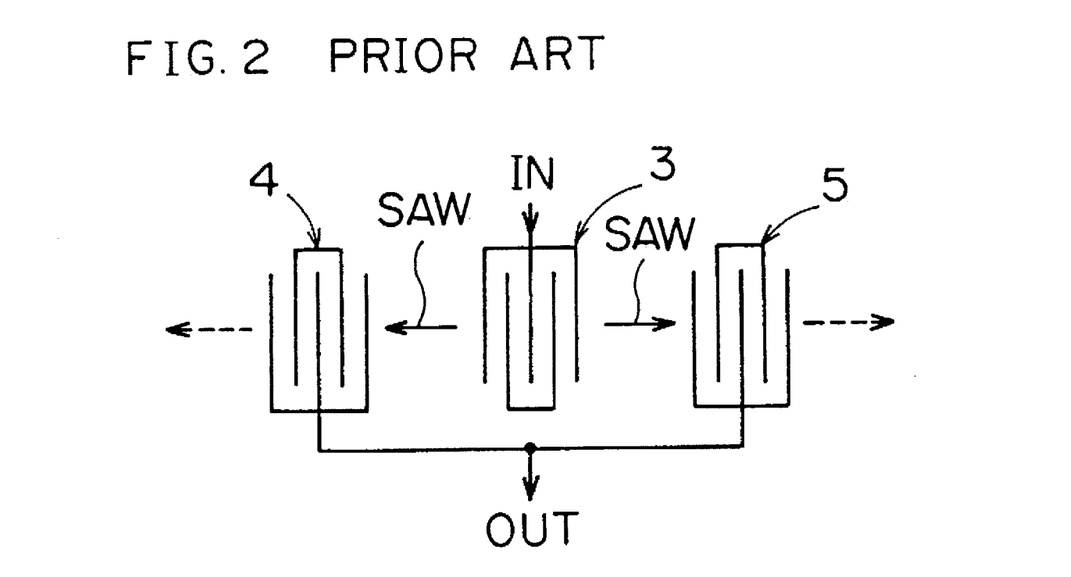
FIG. 2 is a schematic plan view for illustrating a conventional three IDTs type SAW filter.

In a SAW filter having a three-electrode structure schematically shown in FIG. 2, on the other hand, output side IDTs 4 and 5 are arranged on both sides of an input side IDT 3. Therefore, no bidirectional loss is caused in the input side IDT 3. However, leakage signals are still generated outwardly from the output side IDTs 4 and 5 as shown by broken arrows in FIG. 2, causing a large bidirectional loss of about 3 dB.

Figure 3:
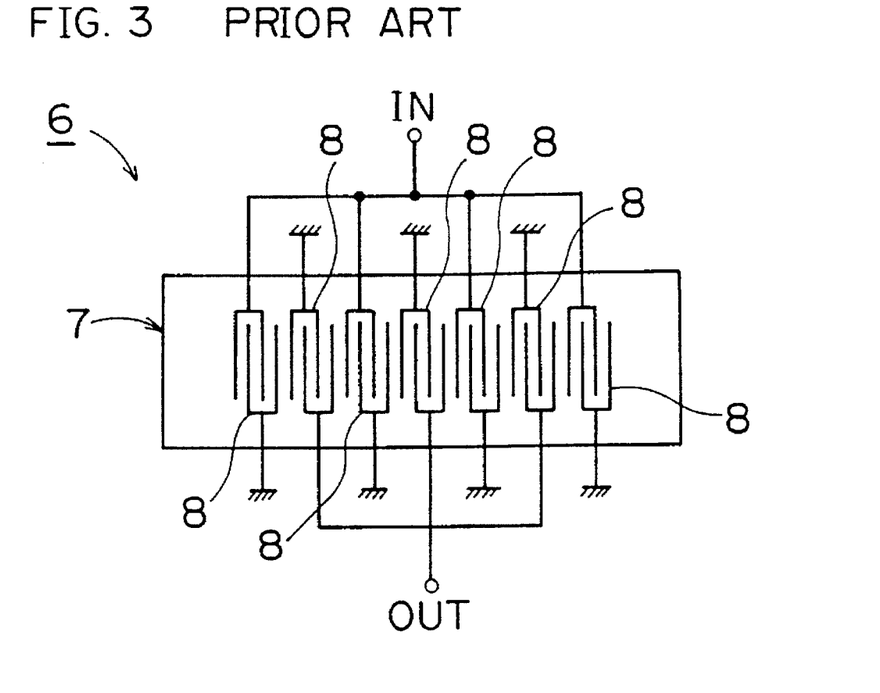
FIG. 3 is a typical plan view for illustrating a conventional IIDT type SAW filter.

In an IIDT type SAW filter 6 shown in a typical plan view of FIG. 3, however, a number of IDTs 8 are arranged on a piezoelectric substrate 7 along a surface wave propagation direction. According to this structure, first comb electrodes of the IDTs 8 are alternately connected to input and output ends IN and OUT along a surface wave propagation direction. In the IIDT type SAW filter, it is possible to reduce bidirectional loss by increasing the number N of the IDTs 8, thereby reducing energy leaking to the exterior of the SAW filter in the surface wave propagation direction.

Assuming that an IIDT type SAW filter is formed by (N−1)/2 input IDTs and (N+1)/2 output IDTs, i.e., N IDTs in total, bidirectional loss is expressed as follows:

$$10 \log\{(N+1)/(N-1)\} \tag{1}$$

In a multielectrode filter having nine IDTs in total, for example, it is possible to reduce bidirectional loss to about 0.97 dB.

While it is possible to extremely reduce the bidirectional loss in the aforementioned IIDT type SAW filter as compared with the two IDTs type or three IDTs type SAW filter, however, the IIDT type SAW filter still has the loss of about 0.97 dB, which must be further reduced.

Figure 4:
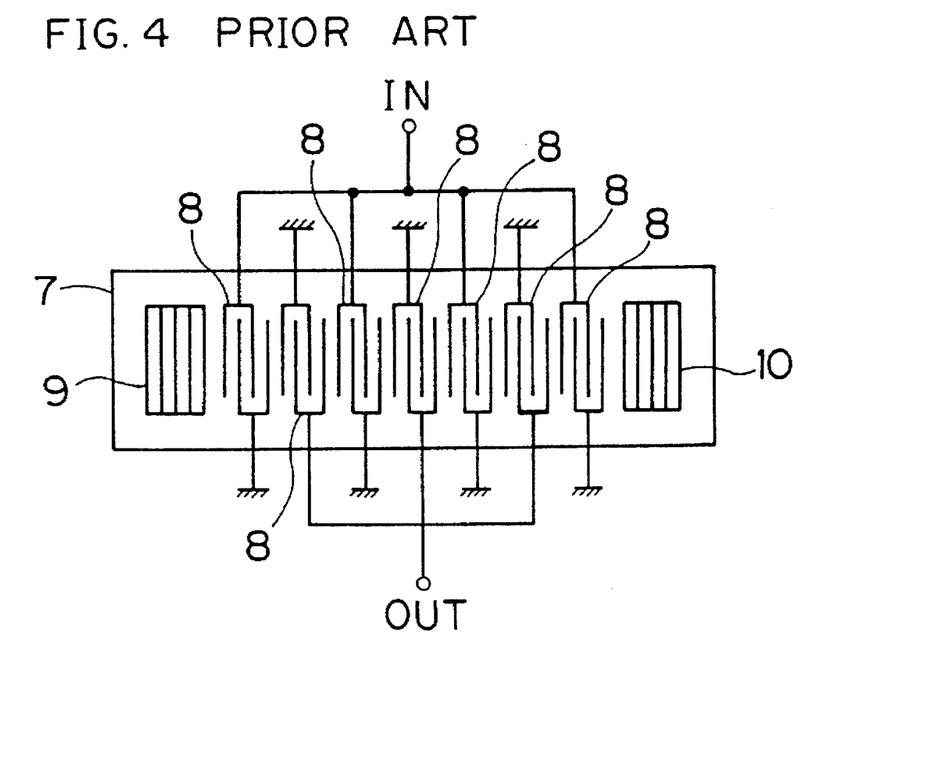
FIG. 4 is a typical plan view for illustrating a conventional IIDT type SAW filter provided with reflectors.

As shown in FIG. 4, therefore, reflectors 9 and 10 are arranged on outer sides of the plurality of IDTs 8 along the surface wave propagation direction, to substantially completely prevent leakage of surface wave energy from the outermost IDTs along the surface wave propagation direction. It is possible in theory to zero the bidirectional loss by arranging such reflectors 9 and 10.

Figure 5:
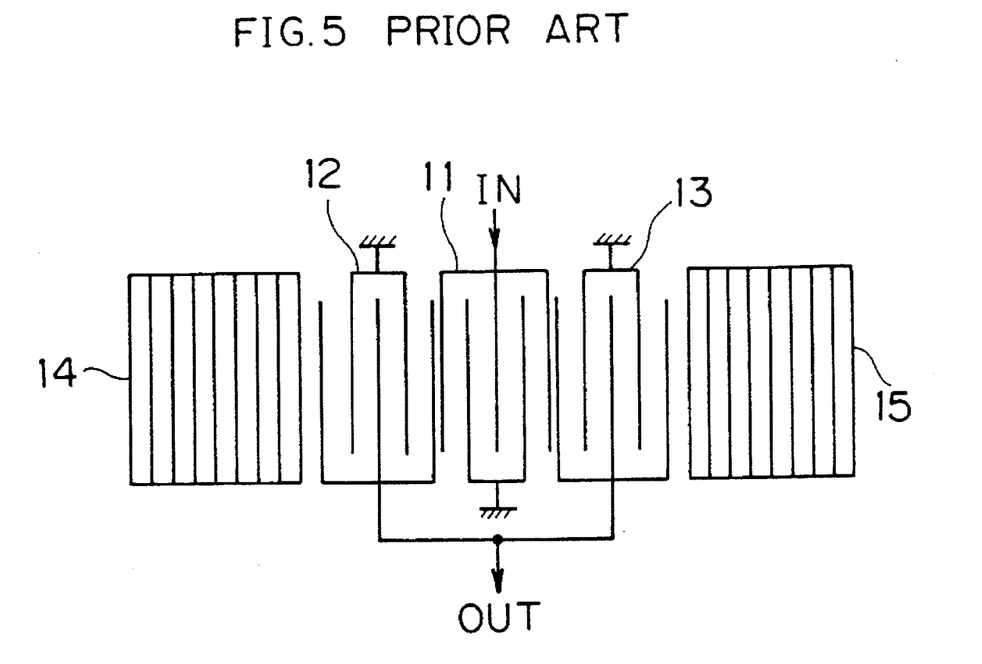
FIG. 5 is a typical plan view showing a conventional vertical coupling type SAW resonator filter.

FIG. 5 shows a vertical coupling type SAW resonator filter having a structure which has been recently studied with interest. This figure is a typical plan view showing only an electrode structure. Output side IDTs 12 and 13 are arranged on both sides of an input side IDT 11. Further, reflectors 14 and 15 are arranged on both sides of the IDTs 11 to 13. In this vertical coupling type surface wave resonator filter 11, it is possible to enlarge the band and reduce the loss, similarly to the aforementioned IIDT type SAW filter having the reflectors 9 and 10.

As hereinabove described, SAW filters are increasingly being developed with a structure wherein reflectors are arranged in some form on both sides of IDTS in the surface wave propagation direction, in order to enlarge the band and reduce the loss in the SAW filter.

In order to implement such a surface acoustic wave filter having a large band and small loss, a substrate material having a large electromechanical coupling factor is often employed. Typical examples of such a substrate are a 36° Y-X LiTaO₃ substrate and a 64° Y-X LiNbO₃ substrate. Table 2 shows material constants of these substrates.

TABLE 2

| | $V_p$ (m/s) | $K^2$ (%) | $\alpha$ (neper/$\lambda$) |
|---|---|---|---|
| 36° Y—X LiTaO₃ | 4100 | 6.5 | 0.004 |
| 64° Y—X LiTaO₃ | 4450 | 10.4 | 0.009 |
| (11$\bar{2}$0)ZnO/ (01$\bar{1}$2)α-Al₂O₃ | 5200–5700 | 4–4.7 | 0.001 |

Referring to Table 2, Vp represents phase velocities, $K^2$ represents electromechanical coupling factors, and α represents attenuation coefficients in metal grating parts measured at 1 GHz, including those attenuated by radiation of bulk waves.

As clearly understood from Table 2, it is possible to increase the band by employing the 36° Y-X LiTaO₃ substrate or the 64° Y-X LiNbO₃ substrate having an extremely large electromechanical coupling factor $K^2$. However, further reduction of the loss is inhibited by a relatively large attenuation coefficient $\alpha$.

On the other hand, Table 2 also shows material constants of a piezoelectric substrate (hereinafter referred to as a ZnO/$\alpha$-Al$_2$O$_3$ substrate) comprising a $(01\bar{1}2)$ plane $[0\bar{1}11]$ $\alpha$-Al$_2$O$_3$ substrate and a $(11\bar{2}0)$ plane $[0001]$ ZnO piezoelectric thin film formed on the substrate. As clearly understood from Table 2, the ZnO/$\alpha$-Al$_2$O$_3$ substrate has a large phase velocity Vp as well as a large electromechanical coupling factor $K^2$. Thus, this substrate satisfies the requirements for a high acoustic velocity and a high coupling property, while also having an extremely small attenuation constant $\alpha$. Thus, it is conceivably possible to readily reduce losses in a filter employing this substrate.

Thus, it is conceivably preferable to employ an IIDT type SAW filter provided with reflectors or a vertical coupling type SAW resonator filter utilizing a ZnO/$\alpha$-Al$_2$O$_3$ substrate as an RF stage filter for a terminal of each mobile communication device shown in Table 1.

In order to enlarge the pass band, however, it is necessary to widen stop bands of the reflectors, as a matter of course. While Table 1 shows specific bandwidths in the pass bands of the respective mobile communication devices, these specific bandwidths are mere minimum necessary values. In mass production, central frequencies and specific bandwidths are unavoidably dispersed, and frequency fluctuation caused by the ambient temperature etc. must also be taken into consideration. Therefore, bandwidths of the stop bands of the reflectors must conceivably be at least 1.5 times those shown in Table 1. Table 1 also shows values obtained by multiplying the specific bandwidths of the respective mobile communication devices by 1.5, for reference.

When the aforementioned substrate material is employed to form a SAW filter, therefore, the specific bandwidths of the stop bands of the reflectors are preferably at least about 1.5%, as clearly understood from Table 1.

In order to enlarge the specific bandwidths of the stop bands of the reflectors, admittance ratios of the reflectors may be increased, i.e., the reflectors may be increased in thickness. When the reflectors are increased in thickness, however, bulk wave radiation is increased in metal strip portions of the reflectors extending perpendicularly to the surface wave direction, to increase bulk wave conversion loss.

Also, the surface wave greatly attenuates due to applied mass of the metal strip, thereby causing an increase of the propagation loss, that is an, increase in the attenuation constant $\alpha$.

In consideration of the balance between the increase of the admittance ratios caused by an increase of the thicknesses, and the increase of the bulk wave radiation or the attenuation constant due to the applied mass, the specific bandwidths of the stop bands are inevitably restricted. Namely, it is necessary to sacrifice reduction of insertion loss to some extent, in order to enlarge the bands of the reflectors.

Thus, it is conceivably possible to form a SAW device having smaller loss as compared with other devices by employing a ZnO/$\alpha$-Al$_2$O$_3$ substrate having a small attenuation constant, while up to now there have been clarified no concrete conditions which can implement such a SAW device.

SUMMARY OF THE INVENTION

An object of the present invention is to provide a SAW device having low insertion loss and a large band while effectively enlarging specific bandwidths of stop bands in reflectors, by employing a ZnO/$\alpha$-Al$_2$O$_3$ substrate which can reduce insertion loss.

A SAW device according to the present invention comprises a piezoelectric substrate which is formed by a $(01\bar{1}2)$ plane $\alpha$-Al$_2$O$_3$ substrate and a $(11\bar{2}0)$ plane ZnO piezoelectric thin film provided thereon, at least one interdigital transducer which is formed on the piezoelectric substrate, and reflectors which are arranged on both sides of the interdigital transducer along a surface wave propagation direction. Each of the reflectors is so formed that a ratio H/$\lambda$ of its thickness H to a wavelength $\lambda$ of a surface wave is in a range of 0.015 to 0.041.

The present invention is characterized in that the ZnO/$\alpha$-Al$_2$O$_3$ substrate is employed as a substrate material, and that each reflector is formed to have the aforementioned specific thickness. Therefore, other structures, such as that of the interdigital transducer which is arranged between the reflectors, for example, are not restricted according to the invention. The well-known two-electrode, three-electrode or IIDT type SAW filter or a vertical coupling type surface wave resonator filter can be properly used.

The inventor has noted the small loss property of the aforementioned ZnO/$\alpha$-Al$_2$O$_3$ substrate, and has studied in depth forming various SAW filters through such piezoelectric substrates. Consequently, the inventor has discovered that it is possible to remarkably enlarge specific bandwidths of stop bands in reflectors which are formed on both sides of an IDT without sacrificing reduction of insertion loss, by controlling thicknesses of the reflectors in a specific range. Namely, the present invention enables implementation of both reduction of insertion loss and enlargement of specific bandwidths of stop bands, by bringing the ratio H/$\lambda$ of the thickness H of each reflector to the wavelength $\lambda$ of the surface wave into the range of 0.015 to 0.041 as hereinabove described. Such a structure has been first confirmed by experiments made by the inventor.

According to the present invention, the ratio H/$\lambda$ of the thickness H of each reflector to the wavelength $\lambda$ of the surface wave is brought into the aforementioned specific range, whereby it is possible to provide a SAW device having low insertion loss with large specific bandwidths of stop bands of 1.5 to 4.2% and an attenuation constant of not more than 0.003 neper/$\lambda$, as clearly understood from an example of the present invention described later.

Thus, it is possible to implement a SAW device which can enlarge its bandwidth without sacrificing the small loss property of the ZnO/$\alpha$-Al$_2$O$_3$ substrate. Therefore, it is possible to provide a SAW device which is optimum as an RF stage filter for an arbitrary mobile radio communication system.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An example of the present invention is now described with reference to the drawings, to clarify the present invention.

A $(11\bar{2}0)$ plane ZnO thin film was epitaxially grown on a $(01\bar{1}2)$ plane of an $\alpha$-$Al_2O_3$ substrate by sputtering. Crystallographic orientational relation between the substrate and the thin film was as follows:

Namely, the aforementioned ZnO/$\alpha$-$Al_2O_3$ substrate was formed.

Figure 6A:
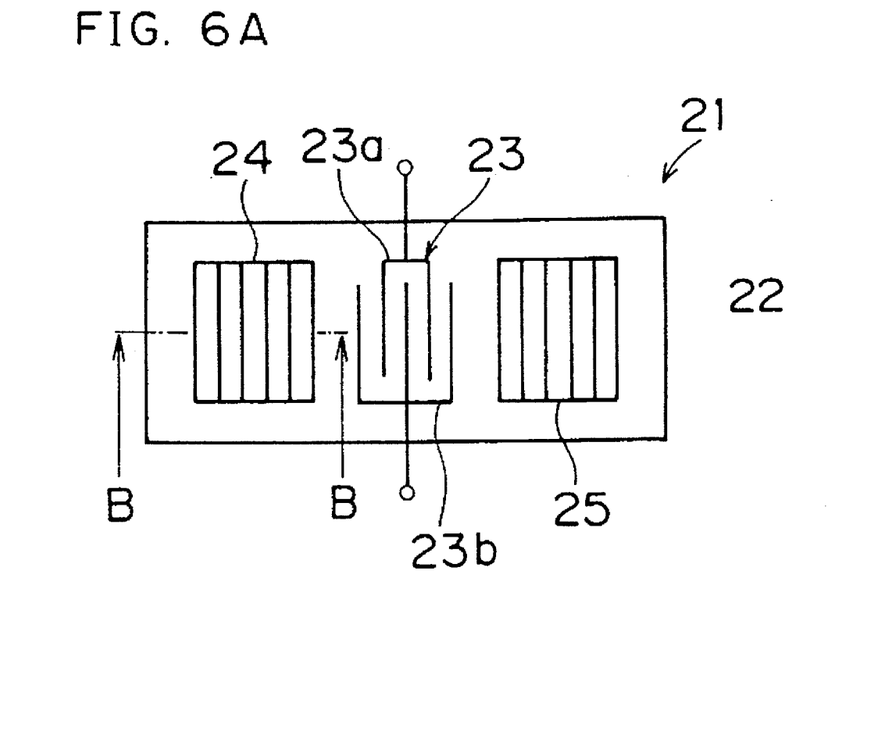
FIGS. 6A and 6B are a typical plan view and a partially fragmented sectional view taken along the line B—B in FIG. 6A, showing a 1-port SAW resonator filter prepared according to the example described herein.
Figure 6B:
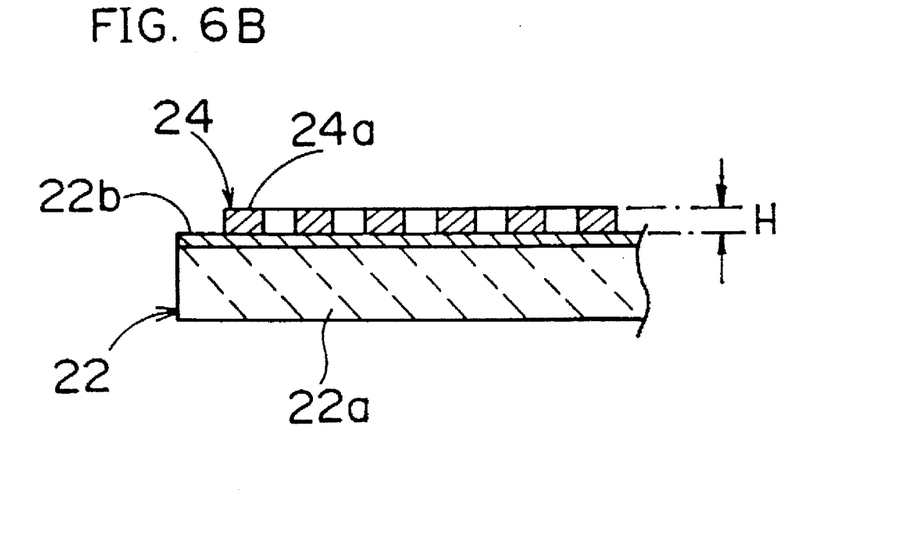
Figure 7:
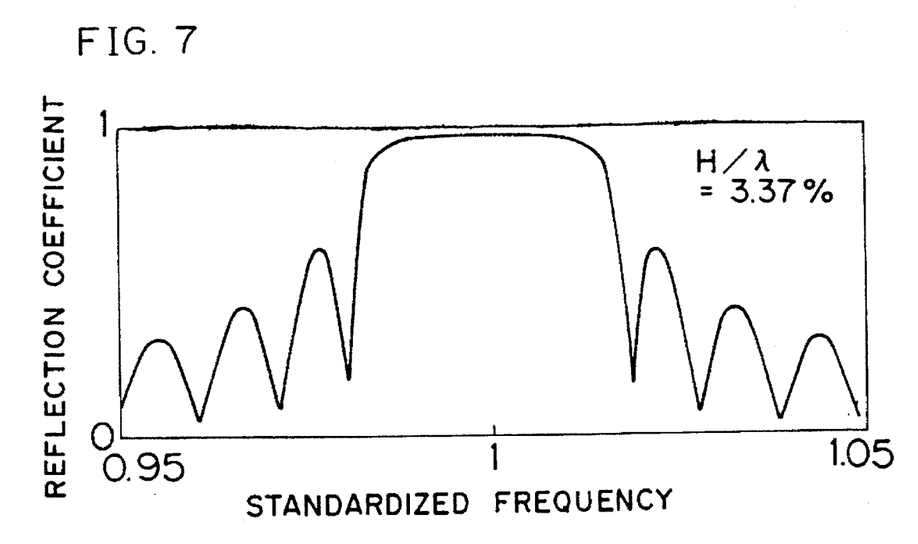
FIG. 7 illustrates reflection characteristics of reflectors in a case of H/λ×100=3.37%.
Figure 8:
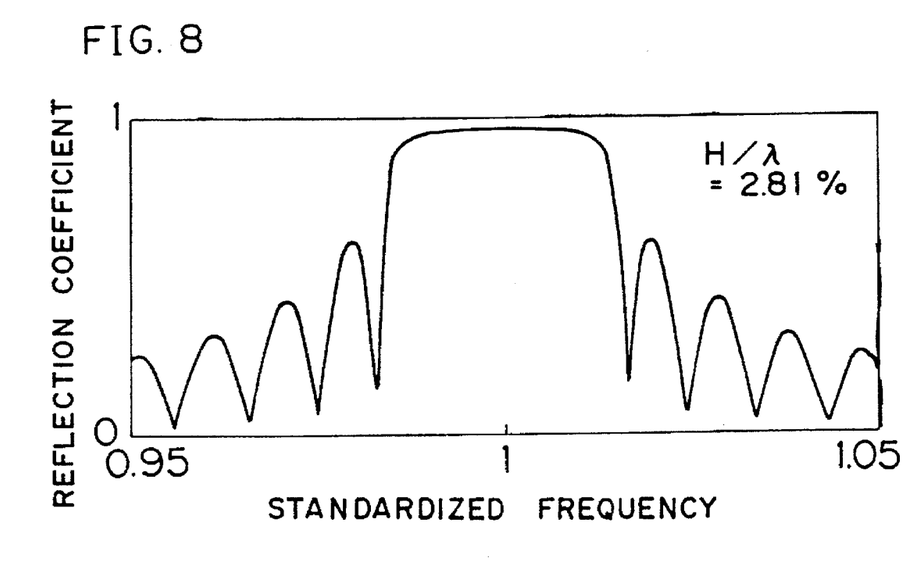
FIG. 8 illustrates reflection characteristics of the reflectors in a case of H/λ×100=2.81%.
Figure 9:
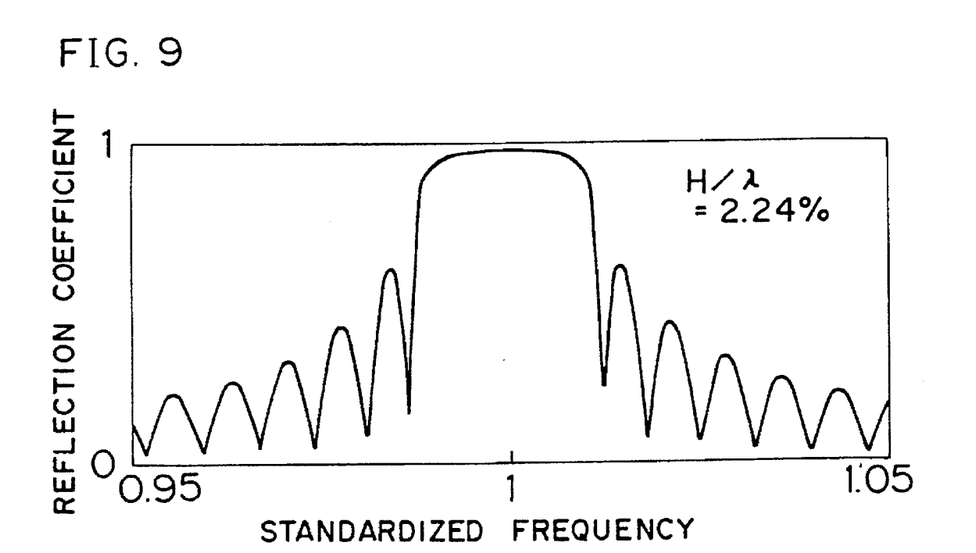
FIG. 9 illustrates reflection characteristics of the reflectors in a case of H/λ×100=2.24%.
Figure 10:
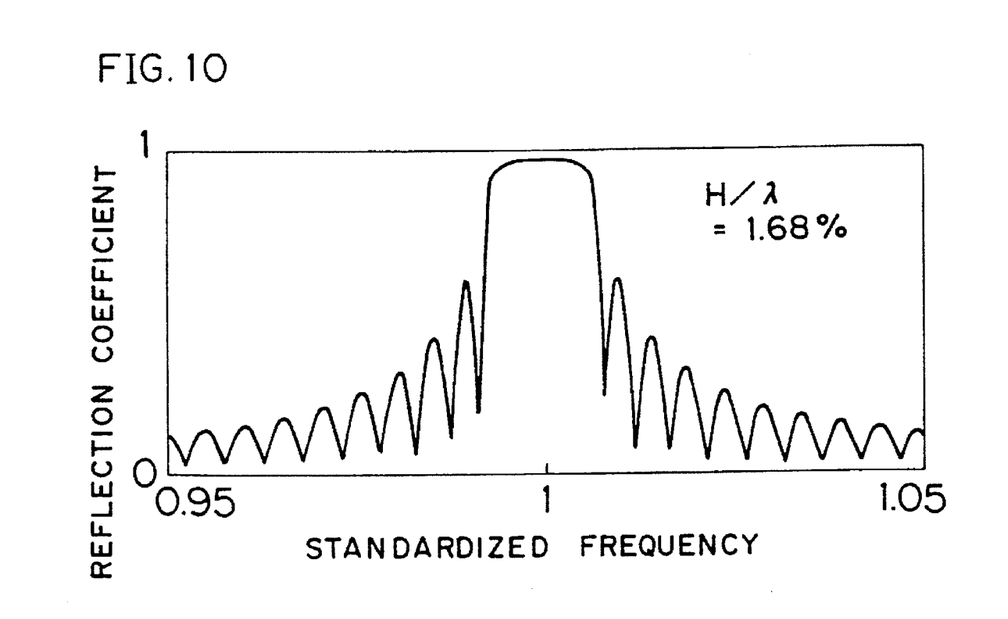
FIG. 10 illustrates reflection characteristics of the reflectors in a case of H/λ×100=1.68%.

Electrodes of aluminum were formed on the aforementioned piezoelectric substrate as shown in FIG. 6A, thereby forming a 1-port surface wave resonator 21. Referring to FIG. 6A, the 1-port surface wave resonator 21 is formed by a piezoelectric substrate 22 consisting of the aforementioned ZnO/$\alpha$-$Al_2O_3$ substrate. In FIG. 6B, numeral 22a denotes an $\alpha$-$Al_2O_3$ substrate, and numeral 22b denotes a ZnO piezoelectric thin film. In FIG. 6A, a single interdigital transducer 23 is formed on an upper surface of the ZnO/$\alpha$-$Al_2O_3$ piezoelectric substrate 22, and reflectors 24 and 25 are arranged on both sides of the interdigital transducer 23 along a surface wave propagation direction. The interdigital transducer 23 is provided with a pair of comb electrodes 23a and 23b having plural electrode fingers which are interdigitated with each other. The reflectors 24 and 25, which are called grating type reflectors, are made of aluminum similarly to the IDT 23 in the form of lattices as shown in FIGS. 6A and 6B.

In such a 1-port SAW resonator 21, a ratio h/λ of a thickness h of the ZnO thin film 22b to a wavelength λ of a surface wave was about 0.3. The wavelength λ of the surface wave was 3.52 μm, and the IDT 23 had 10 pairs of electrode fingers. Further, numbers of reflector portions 24a (metal strip portions extending perpendicularly to the surface wave propagation direction) were so selected that reflection coefficients were at least 0.97.

In the 1-port SAW resonator 21 having the aforementioned structure, the thicknesses of the reflectors 24 and 25 were varied to measure reflection characteristics. FIGS. 7 to 10 show the results.

The characteristics shown in FIGS. 7 to 10 were measured when values obtained by multiplying ratios H/λ of thicknesses H of the reflectors 24 and 25 to the wavelengths λ of the surface waves by 100 were 3.37% 2.81%, 2.24% and 1.68% respectively. Referring to FIGS. 7 to 10, the axes of abscissas show standardized frequencies which were standardized through central frequencies, and the axes of ordinates show reflection coefficients.

It is clearly understood from FIGS. 7 to 10 that the reflection characteristics of the reflectors are varied with the ratios H/λ.

Figure 11:
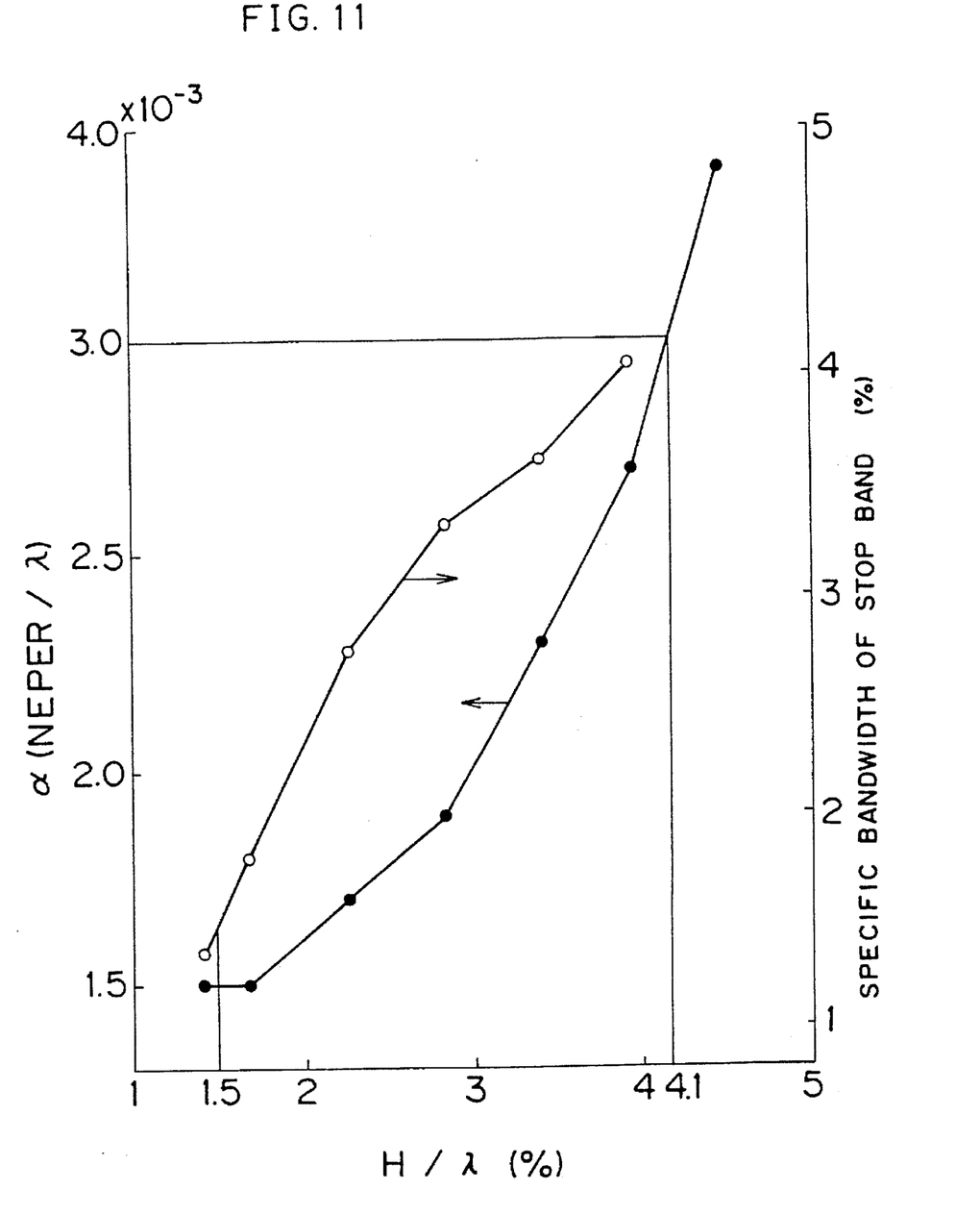
FIG. 11 illustrates relations between ratios H/λ (%), attenuation constants α and specific bandwidths (%) of stop bands.

From the above results, stop bandwidths in the reflectors 24 and 25 were obtained and specific bandwidths of the stop bands were calculated from the stop bandwidths. On the other hand, attenuation constants α in the reflectors 24 and 25 were separately measured. FIG. 11 shows relations between the ratios H/λ, the attenuation constants α and the specific bandwidths of the stop bands.

Assuming that an attenuation constant α which is necessary for forming a SAW filter provided with reflectors for remarkably reducing insertion loss as compared with the 36° Y-X $LiTaO_3$ substrate or the 64° Y-X $LiNbO_3$ substrate is not more than 0.003 neper/λ as shown in Table 2, the range of H/λ×100 (%) for increasing the specific bandwidths of the stop bands to at least 1.5% is 1.5 to 4.1%, as clearly understood from FIG. 11. Namely, the ratio H/λ must be within a range of 0.015 to 0.041, and the specific bandwidths of the stop bands are about 4.2% when the ratio H/λ is 0.41. Thus, it is possible to obtain a SAW filter which is preferably applicable to most of the mobile communication devices shown in Table 1 according to the present invention.

In this case, further, the small loss property, which is the excellent advantage of ZnO/$\alpha$-$Al_2O_3$, is not damaged due to the attenuation constant α of not more than 0.003 neper/λ.

Thus, the specific bandwidths of the stop bands can be enlarged without damaging the small loss property of the ZnO/$\alpha$-$Al_2O_3$ substrate when the ratio H/λ is brought into the range of 0.015 to 0.041, whereby it is possible to provide a SAW filter having low insertion loss and a wide band.

Although the above Example has been described with reference to a filter forming the 1-port SAW resonator 21 shown in FIG. 6, the present invention is also applicable to another SAW filter provided with reflectors, such as a two IDTs type or three IDTs type SAW filter, the multielectrode SAW filter shown in FIG. 4, or the vertical coupling type SAW resonator filter shown in FIG. 5, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave (SAW) filter having a bandwidth, said filter comprising:

a piezoelectric substrate consisting of a non-piezoelectric $(01\bar{1}2)$ plane $\alpha$-$Al_2O_3$ substrate and a $(11\bar{2}0)$ plane ZnO piezoelectric thin film being formed thereon;

at least one interdigital transducer being formed on said piezoelectric substrate; and reflectors being arranged on both sides of said at least one interdigital transducer along a surface wave propagation direction, each said reflector being so formed that a ratio H/λ of its thickness H to a wavelength λ of a surface wave is in a range of 0.015 to 0.041 whereby said range of H/λ ratio optimizes said bandwidth of said filter.

2. A surface acoustic wave filter in accordance with claim 1, wherein said SAW filter is a 1-port surface wave resonator having one said interdigital transducer.

3. A surface acoustic wave filter in accordance with claim 1, wherein said SAW filter is a multielectrode surface acoustic wave filter, at least three said interdigital transducers being arranged along said surface wave propagation direction.

4. A surface acoustic wave filter in accordance with claim 1, wherein said SAW filter is a vertical coupling type surface acoustic wave filter having at least three said interdigital transducers.

5. A surface acoustic wave filter in accordance with claim 1, wherein each said reflector has a plurality of metal strip portions extending perpendicularly to said surface wave propagation direction.

6. A surface acoustic wave filter in accordance with claim 1, wherein said interdigital transducer and said reflectors are made of aluminum.

* * * * *